(12) United States Patent
Nishiki et al.

(10) Patent No.: US 10,754,146 B2
(45) Date of Patent: Aug. 25, 2020

(54) DISPLAY DEVICE AND MANUFACTURING METHOD THEREFOR

(71) Applicant: Sharp Kabushiki Kaisha, Sakai, Osaka (JP)

(72) Inventors: Hirohiko Nishiki, Sakai (JP); Tohru Okabe, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 660 days.

(21) Appl. No.: 15/509,525

(22) PCT Filed: Aug. 31, 2015

(86) PCT No.: PCT/JP2015/074696
§ 371 (c)(1),
(2) Date: Jul. 18, 2017

(87) PCT Pub. No.: WO2016/039209
PCT Pub. Date: Mar. 17, 2016

(65) Prior Publication Data
US 2018/0239127 A1    Aug. 23, 2018

(30) Foreign Application Priority Data

Sep. 11, 2014 (JP) .................................. 2014-185726

(51) Int. Cl.
G02B 26/02 (2006.01)
H01L 29/786 (2006.01)
G09F 9/37 (2006.01)
B81B 3/00 (2006.01)
(Continued)

(52) U.S. Cl.
CPC ............ *G02B 26/02* (2013.01); *B81B 3/0035* (2013.01); *G02B 26/023* (2013.01); *G02F 1/133509* (2013.01); *G09F 9/37* (2013.01); *H01L 29/786* (2013.01); *H01L 29/7869* (2013.01);
(Continued)

(58) Field of Classification Search
None
See application file for complete search history.

(56) References Cited

U.S. PATENT DOCUMENTS

| 2004/0257505 | A1 | 12/2004 | Takizawa et al. |
| 2015/0221677 | A1 | 8/2015 | Okabe et al. |

FOREIGN PATENT DOCUMENTS

| EP | 1859311 B1 * | 11/2008 | ........... G09G 3/3433 |
| JP | 2004-354971 A | 12/2004 | |
| JP | 2008-533510 A | 8/2008 | |

(Continued)

OTHER PUBLICATIONS

Official Communication issued in International Patent Application No. PCT/JP2015/074696, dated Dec. 1, 2015.

*Primary Examiner* — Darryl J Collins
*Assistant Examiner* — Journey F Sumlar
(74) *Attorney, Agent, or Firm* — Keating & Bennett, LLP

(57) ABSTRACT

A display device includes: a translucent substrate; a light-shielding film provided on the translucent substrate; first transparent insulating films that are provided on the translucent substrate so as to cover the covering the light-blocking film; and a plurality of thin film transistors (TFTs) that are provided on the first transparent insulation films and include a portion of lines made of conductive films. The light-shielding film is arranged so as to overlap at least the TFTs, when viewed in a direction vertical to the translucent substrate.

13 Claims, 14 Drawing Sheets

(51) Int. Cl.
*G02F 1/1335* (2006.01)
*H01L 27/12* (2006.01)

(52) U.S. Cl.
CPC .. *H01L 29/78633* (2013.01); *B81B 2201/047* (2013.01); *H01L 27/1225* (2013.01)

(56) References Cited

FOREIGN PATENT DOCUMENTS

| | | |
|---|---|---|
| JP | 2013-050720 A | 3/2013 |
| WO | 2006/091860 A2 | 8/2006 |
| WO | 2007/075832 A2 | 7/2007 |
| WO | 2014/046068 A1 | 3/2014 |

* cited by examiner

DISPLAY DEVICE AND MANUFACTURING METHOD THEREFOR

TECHNICAL FIELD

The present invention relates to a display device and to a method for producing the same.

BACKGROUND ART

In recent years, a microelectromechanical system (MEMS) display has been proposed as a display device in which mechanical shutters are used. For example, Patent Document 1 shown below discloses a transmission type MEMS display. In this MEMS display, a plurality of shutter portions formed with MEMS are arrayed in matrix, corresponding to pixels on a first substrate that includes thin film transistors (hereinafter referred to as TFTs as well). In a light-shielding film laminated on a first substrate side of a second substrate, a plurality of openings are provided that are arrayed in matrix so as to correspond to the pixels, respectively. When the shutter portions move, the openings are opened/closed, which cause light from a backlight unit to be transmitted toward the display surface or to be blocked.

PRIOR ART DOCUMENT

Patent Document

Patent Document 1: JP-A-2013-50720

SUMMARY OF THE INVENTION

Problem to be Solved by the Invention

In a MEMS display, typically, as illustrated in FIG. 18, a light-shielding film 91 are provided on substrate 90 side (display viewing side) surfaces of first conductive films M1 that form gate lines, gate electrodes, and the like. In a case where no light-shielding film 91 is provided, external light that intrudes from the display viewing side into the inside of the display device is reflected on display viewing side surfaces of the first conductive films M1 having high reflectance, and this causes problems such as the reduction of contrast. To cope with this, commonly, a light-shielding film 91 is formed by using, for example, a light interference layer in which an inorganic insulating film obtained by laminating oxides having different refractive indices is used, so that the problem of the contrast reduction is suppressed. For example, in a case where the light-shielding film 91 is formed with an inorganic insulating film obtained by laminating oxides, this configuration exhibits certain effects regarding the suppression of reflection of external light that advances from the display viewing side in a direction vertical to the substrate 90. However, with respect to external light that advances in a direction oblique to the substrate 90, and external light that has a specific wavelength, reflection of the same cannot be effectively suppressed.

Further, from a viewpoint of the selection of optimal materials and processing conditions, it is difficult to provide a conductive film in a layer above the first conductive films M1 (for example, second conductive films M2) having a configuration identical to that for the light-shielding film 91. It is therefore difficult to suppress the reflection of external light at a conductive film in a layer above the second conductive films M2.

Still further, since the light-shielding film 91 is in the same line pattern as that for the first conductive films M1, it is impossible to prevent external light from advancing into the inside of the display device through portions of the first conductive films M1 where lines are not provided. It is therefore unavoidable that external light advances through clearances between the lines of the first conductive films M1 into the inside of the display device and reaches the TFTs 92. If external light advances from the display viewing side to the MEMS display and reaches the TFTs 92, this would lead to a risk that the TFTs 92, exposed to light, deteriorate and threshold values for TFT driving decrease. Particularly in a case where the TFTs 92 are formed with oxide semiconductor films, the deterioration of the TFTs 92 caused by light becomes noticeable.

It is an object of the present invention to obtain a MEMS-shutter-provided display device having excellent TFT driving stability, and a method for producing the same.

Means to Solve the Problem

A display device of the present invention includes: a translucent substrate; shutter portions that are provided on the translucent substrate so as to correspond to a plurality of pixels, respectively, each shutter portion controlling an amount of light that passes through a light transmitting region, by means of a shutter; a light-shielding film provided on the translucent substrate; a transparent insulating film that is provided on the translucent substrate so as to cover the light-shielding film; and a plurality of thin film transistors that are provided on the transparent insulating film and include a part of a line formed with a conductive film. The light-shielding film is arranged so as to overlap at least the thin film transistors, when viewed in a direction vertical to the translucent substrate.

Effect of the Invention

In the case of the display device of the present invention, excellent TFT driving stability can be achieved. Further, by the method for producing the display device according to the present invention, a display device having excellent TFT driving stability can be obtained.

MODE FOR CARRYING OUT THE INVENTION

Figure 1:
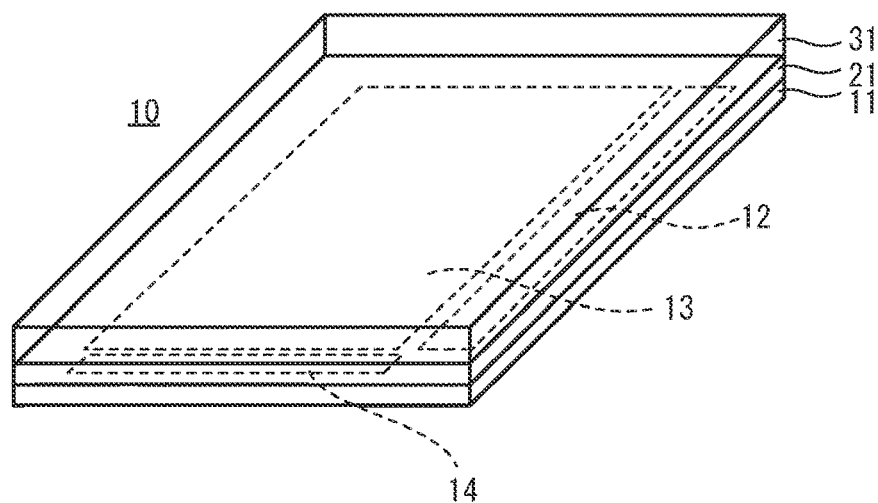
FIG. 1 is a perspective view illustrating a schematic configuration of a display device.

A display device according to one embodiment of the present invention is a display device having a plurality of pixels, and the display device includes: a translucent substrate; shutter portions that are provided on the translucent substrate so as to correspond to the pixels, respectively, each shutter portion controlling an amount of light that passes through a light transmitting region, by means of a shutter; a light-shielding film provided on the translucent substrate; a first transparent insulating film that is provided on the translucent substrate so as to cover the light-shielding film; and a plurality of thin film transistors that are provided on the first transparent insulating film and include a part of a line formed with a conductive film. The light-shielding film is arranged so as to overlap at least the thin film transistors, when viewed in a direction vertical to the translucent substrate.

According to the configuration described above, the light-shielding film is arranged so as to overlap at least the thin film transistors, when viewed in the direction vertical to the translucent substrate. External light advancing from the translucent substrate side into the display device, therefore, is blocked by the light-shielding film, and is prevented from reaching the TFTs. The threshold value properties and the like of the TFTs, therefore, can be prevented from deteriorating due to external light advancing from the translucent substrate side into the display device.

The light-shielding film of the display device of the present invention is preferably arranged in entire areas of the pixels except for the light transmitting regions, when viewed in a direction vertical to the translucent substrate.

According to the above-described configuration, the light-shielding film is arranged in entire areas except for the light transmitting regions, which enables to more efficiently block light incident from the translucent substrate side. Further, according to the above-described configuration, when viewed in the direction vertical to the translucent substrate, the light-shielding film is arranged in entire areas of the pixels except for the light transmitting regions. This makes it possible to block external light advancing from the translucent substrate side into the display device, by means of the light-shielding film. In other words, external light advancing from the translucent substrate side into the display device is prevented from being reflected by metal films toward the display viewing side, which makes it possible to suppress reductions in the contrast caused by the reflection of external light.

In the display device of the present invention each shutter portion may include: a shutter body that is movable according to a voltage applied thereto; a shutter beam that is electrically connected with the shutter body, and is elastically deformed according to a voltage applied thereto so as to make the shutter body movable; a shutter beam anchor that is electrically connected with the shutter beam and supports the shutter beam; a driving beam opposed to the shutter beam; and a driving beam anchor that is electrically connected with the driving beam and supports the driving beam.

The first transparent insulating film of the display device of the present invention is, for example, a silicon-based inorganic film containing oxygen or nitrogen.

The first transparent insulating film of the display device of the present invention preferably covers an entire surface of the light-shielding film.

The first transparent insulating film of the display device of the present invention may have such a configuration in which two or more layers of transparent insulating films are laminated.

The display device of the present invention preferably further includes a light transmission film provided on the first transparent insulating film.

According to the above-described configuration, the light transmission film is provided so as to cover the light-shielding film. Therefore, the distance between the light-shielding film and the TFTs increases. This makes it possible to reduce the parasitic capacitance generated between the light-shielding film and the light transmission film.

The light transmission film of the display device of the present invention is preferably formed with a coating-type material.

The display device of the present invention preferably further includes a second transparent insulating film provided on the light transmission film.

In the display device of the present invention, in the peripheral portion of the translucent substrate, an angle formed between a surface of the translucent substrate and a surface of the light transmission film is preferably smaller than 20°.

According to the above-described configuration, an angle formed between a surface of the translucent substrate and a surface of the light transmission film is smaller than 20°. Even in a case where, in the peripheral portion of the light transmission film, lines and the like rise from the surface of the translucent substrate onto the light transmission film, the above-described configuration can prevent disconnection from occurring to the lines and the like.

The display device of the present invention preferably further includes a counter substrate that is arranged so as to be opposed to the translucent substrate; and a ring-shaped sealing material that bonds peripheral portions of the translucent substrate and the counter substrate. In the peripheral portion of the translucent substrate, the sealing material is preferably arranged so as not to overlap an inclined surface of the light transmission film.

The display device of the present invention may include a light transmission film provided below the first transparent insulating film.

The TFTs, which include oxide semiconductor films, tend to deteriorate due to light; for example, threshold value properties thereof tend to vary due to light. According to the present invention, however, even in a case where the TFTs include oxide semiconductor films, the light-shielding film formed in at least areas that overlap the TFTs prevents light from being projected to the TFTs from the translucent substrate side. The present invention, in which the deterioration of the TFTs is suppressed, is preferable in a case where the TFTs are formed with oxide semiconductor films.

A method for producing the display device of the present invention preferably includes a first annealing step of baking the first transparent insulating film; and a second annealing step of baking the thin film transistor, wherein a treatment temperature in the first annealing step is at or above the treatment temperature in the second annealing step.

The following describes preferred embodiments of the present invention in detail, while referring to the drawings. The drawings referred to in the following description illustrate, for convenience of description, only the principal members necessary for describing the present invention, among the constituent members in the embodiments, in a simplified manner. The present invention, therefore, may include arbitrary constituent members that are not described in the descriptions of the following embodiments. Further, the dimension ratios of the constituent members illustrated in the drawings do not necessarily indicate the real sizes, the real dimension ratios, etc.

Figure 2:
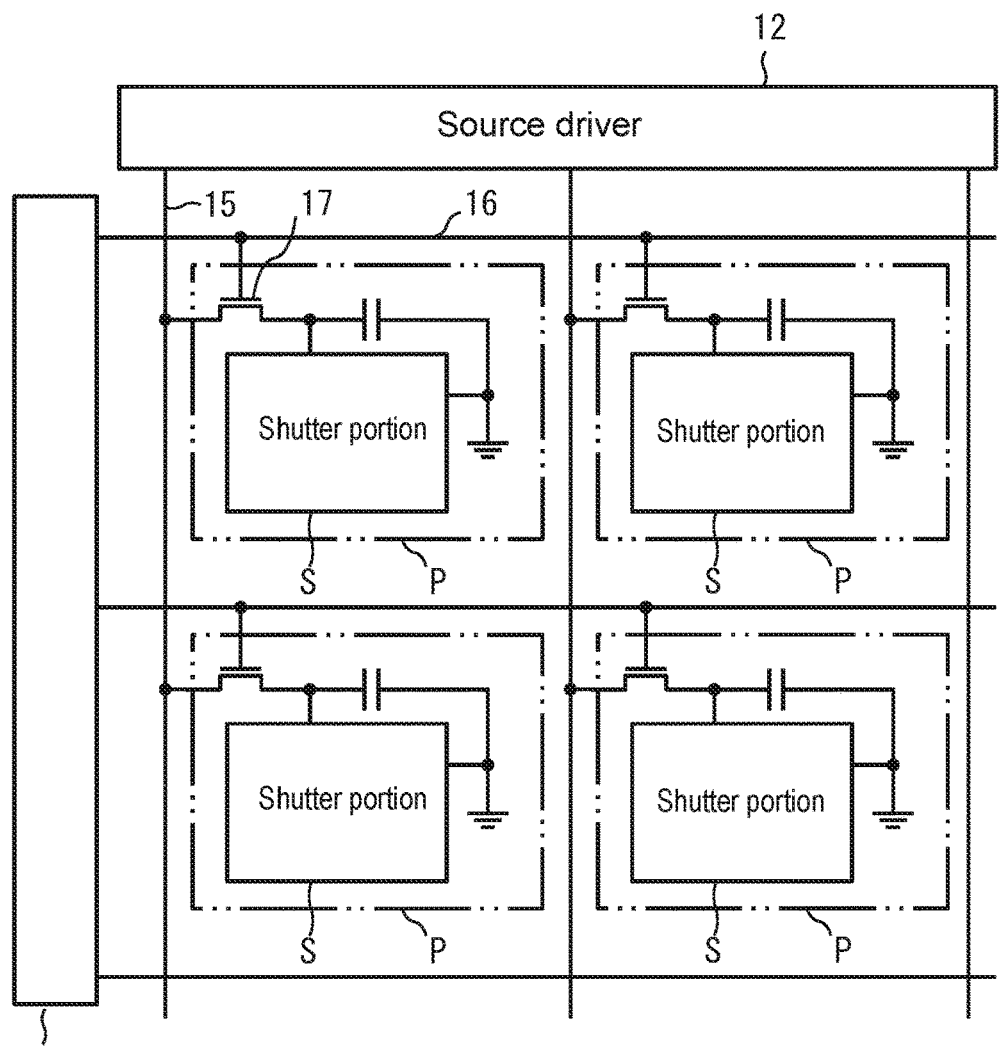
FIG. 2 is an equivalent circuit diagram of the display device.

FIG. 1 is a perspective view illustrating an exemplary configuration of a display device in the present embodiment. FIG. 2 is an equivalent circuit diagram of the display device 10. The display device 10 illustrated in FIG. 1 is a transmission type MEMS display. The display device 10 has a configuration in which a first substrate 11, a second substrate 21, and a backlight 31 are laminated in the stated order.

The first substrate 11 includes a display region 13 in which pixels P for displaying images are arranged, as well as a source driver 12 and a gate driver 14 that supply signals for controlling the transmission of light of each pixel P. The second substrate 21 is provided so as to cover a backlight surface of the backlight 31.

The backlight 31 includes, for example, a red color (R) light source, a green color (G) light source, and a blue color (B) light source so as to project back light to each pixel P. The backlight 31, based on backlight control signals input thereto, causes a prescribed light source to emit light.

As illustrated in FIG. 2, a plurality of data lines 15 and a plurality of gate lines 16 that extend intersecting with the data lines 15 are provided on the first substrate 11, and the pixels P are formed with the data lines 15 and the gate lines 16.

Each data line 15 is connected to the source driver 12, and each gate line 16 is connected to the gate driver 14. The gate driver 14 sequentially inputs, to each gate line 16, a gate signal that switches the gate line 16 to a selected state or a non-selected state, thereby scanning the gate lines 16. The source driver 12 inputs data signals to each data line 15 in synchronization with the scanning of the gate lines 16. This causes desired signal voltages to be applied to respective shutter portions S of the pixels P connected to the selected gate line 16.

Figure 3:
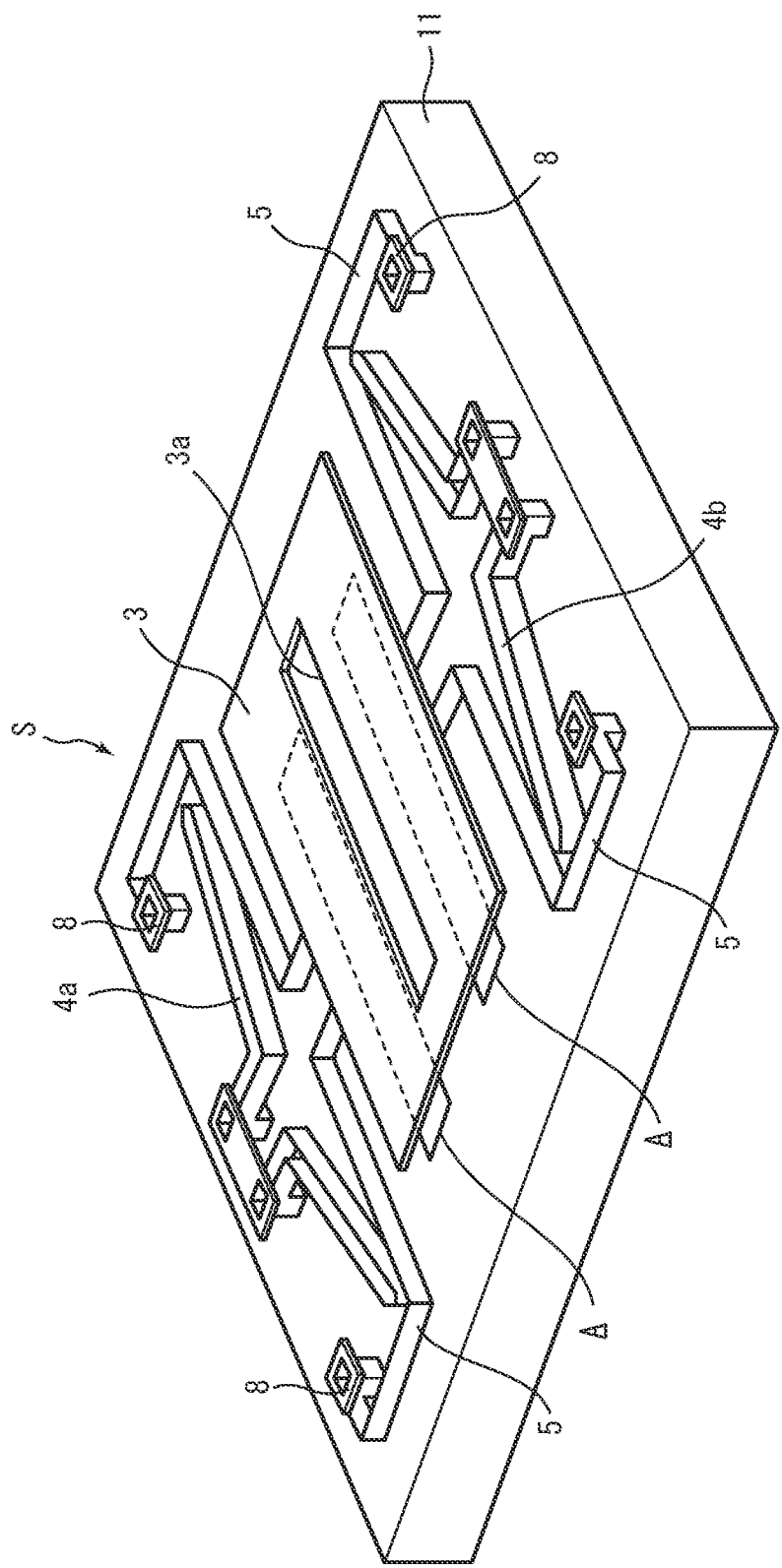
FIG. 3 is a perspective view of a shutter portion.

FIG. 3 is a perspective view illustrating a detailed exemplary configuration of the shutter portion S at one pixel P. The shutter portions S includes a shutter body 3, a first electrode portion 4a, a second electrode portion 4b, and a shutter beam 5.

The shutter body 3 has a plate-like shape. In FIG. 3, for convenience sake of illustration, the shutter body 3 is illustrated as having a flat plate shape, but actually, as illustrated in the cross-sectional views in FIGS. 5 and 7 to be described below, the shutter body 3 has a shape having folds in the lengthwise direction of the shutter body 3. The direction vertical to the lengthwise direction (long side direction) of the shutter body 3, that is, the short side direction, is a direction in which the shutter body 3 is driven (movement direction). The shutter body 3 has an opening 3a that extends in the lengthwise direction. The opening 3a is formed in a rectangular shape having long sides extending in the lengthwise direction of the shutter body 3.

A predetermined voltage is applied to the first electrode portion 4a and the second electrode portion 4b, as will be described later. Each of the first electrode portion 4a and the second electrode portion 4b has two driving beams 6 and a driving beam anchor 7. The two driving beams 6 are arranged so as to be opposed to the shutter beams 5, respectively. The driving beam anchors 7 are electrically connected with the two driving beams 6. Further, the driving beam anchor 7 supports the two driving beams 6.

The shutter body 3 is connected to one end of each shutter beam 5. The other end of each shutter beam 5 is connected to the shutter beam anchor 8 fixed to the first substrate 11. The shutter beams 5 are connected to end portions in the driving direction of the shutter body 3, respectively. The shutter beams 5 extend from the portions connected with the shutter body 3 outward, and further extend along the end portions in the driving direction of the shutter body 3, to be connected to the shutter beam anchors 8. The shutter beams 5 have flexibility. The shutter body 3 is supported in a state movable with respect to the first substrate 11, by the shutter beam anchors 8 fixed to the first substrate 11, and the shutter beams 5 that have flexibility and that connect the shutter beam anchors 8 and the shutter body 3. Further, the shutter body 3 is electrically connected through the shutter beam anchors 8 and the shutter beams 5 to the lines provided on the first substrate 11.

The first substrate 11 has light transmitting regions A as illustrated in FIG. 3. The light transmitting region A has, for example, a rectangular shape corresponding to the opening 3a of the shutter body 3. For example, two light transmitting regions A are provided with respect to one shutter body 3. The two light transmitting regions A are arranged so as to be arrayed in the short side direction of the shutter body 3. In a case where no electric force is exerted between the shutter body 3 and the first electrode portion 4a, and between the shutter body 3 and the second electrode portion 4b, the opening 3a of the shutter body 3 is in a state of not overlapping the light transmitting region A.

In the present embodiment, the driving circuit that controls the shutter portions S supplies a potential having a different polarity to the first electrode portion 4a and the second electrode portion 4b at uniform intervals. Further, the driving circuit that controls the shutter portions S supplies a fixed potential having a positive polarity or a negative polarity to the shutter body 3.

Figure 4:
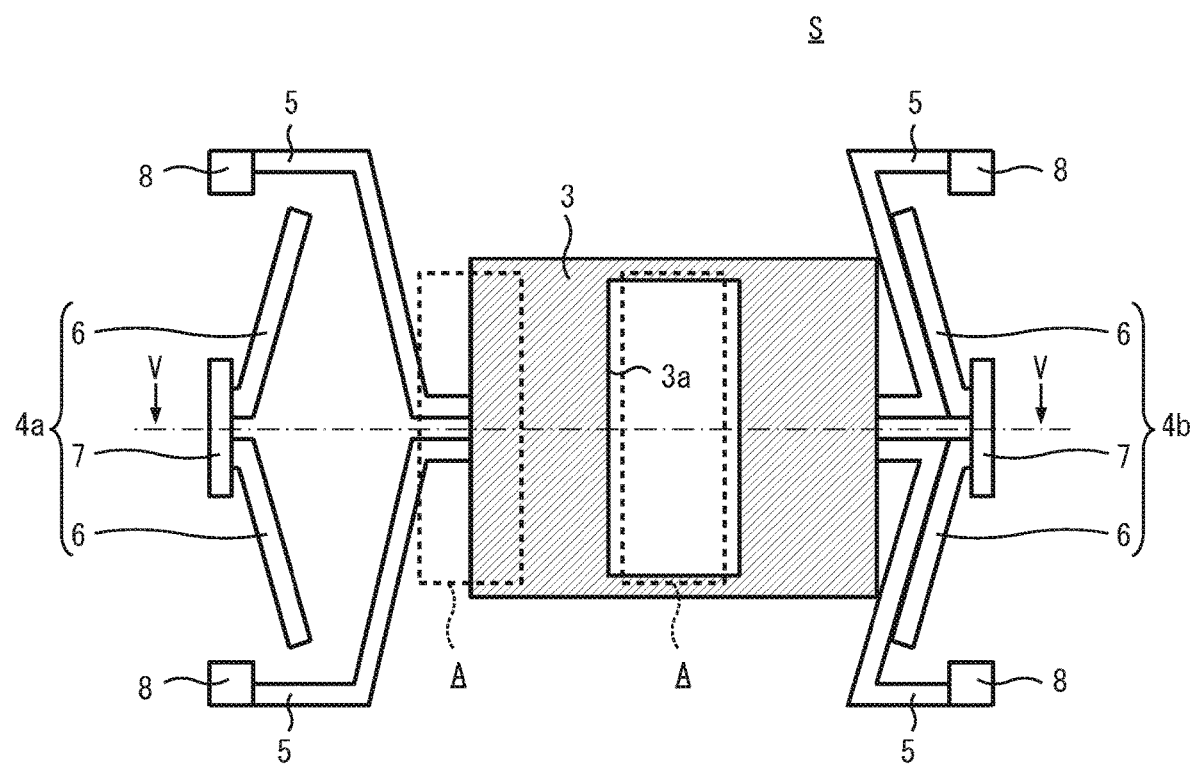
FIG. 4 is a plan view for explaining an operation of the shutter portion.
Figure 5:
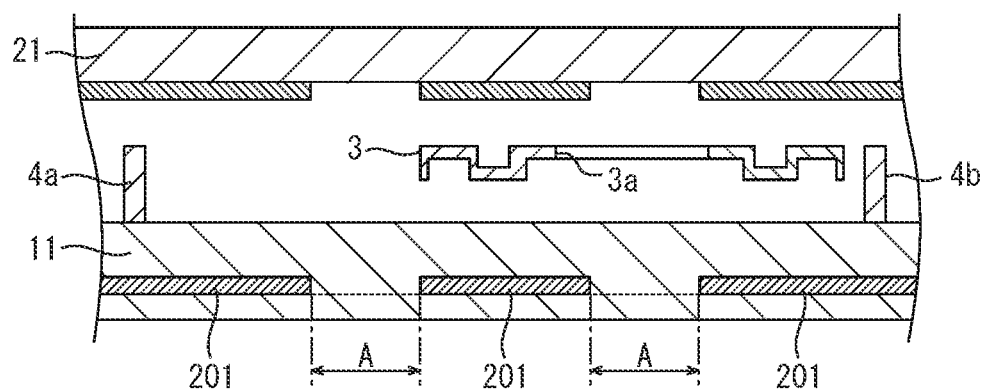
FIG. 5 is a cross-sectional view taken along line V-V in FIG. 4.
Figure 6:
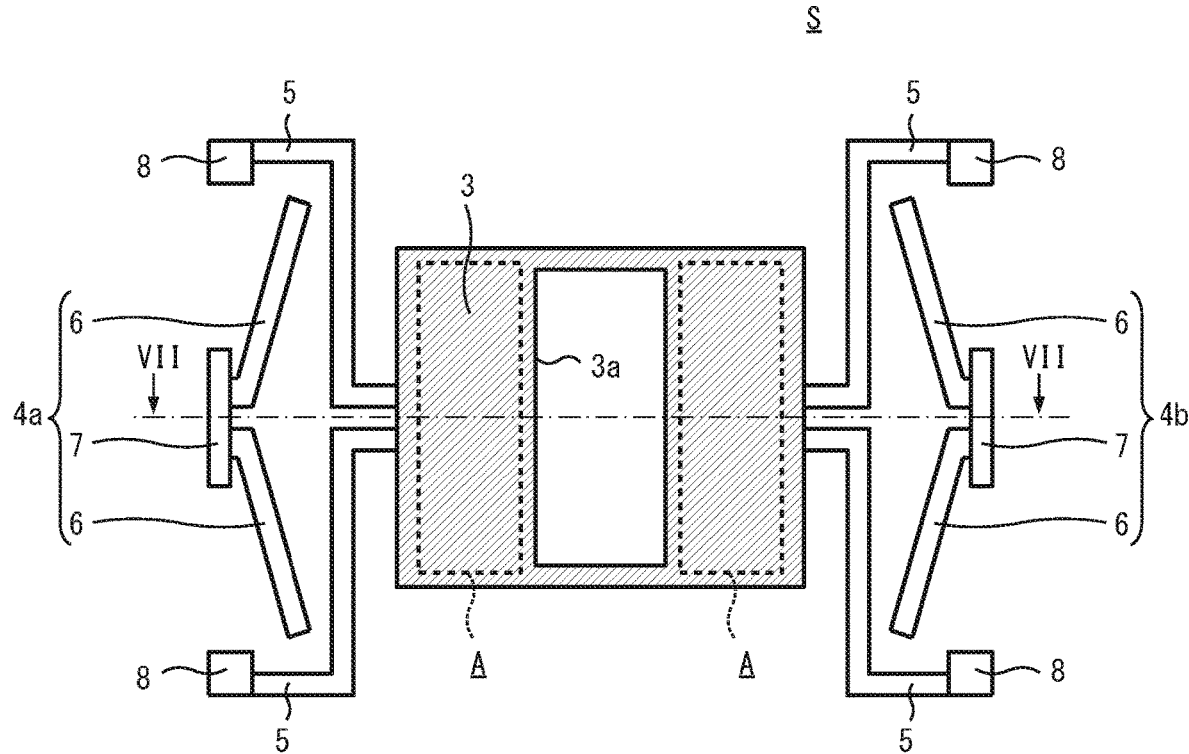
FIG. 6 is a plan view for explaining an operation of the shutter portion.
Figure 7:
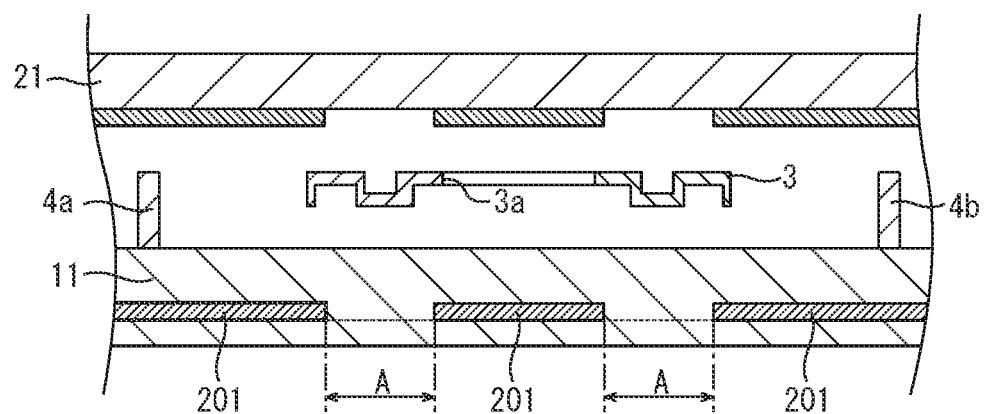
FIG. 7 is a cross-sectional view taken along line VII-VII in FIG. 6.

The following description describes an exemplary case where a potential at a H (High) level is supplied to the shutter body 3. When the driving beam 6 of the first electrode portion 4a has a potential at H level and the driving beam 6 of the second electrode portion 4b has a potential at L (Low) level, electrostatic force causes the shutter body 3 to move toward the side of the second electrode portion 4b having a potential at L level. As a result, as illustrated in FIGS. 4 and 5, the opening 3a of the shutter body 3 overlaps the light transmitting region A, whereby the state shifts to an opened state in which light from the backlight 31 passes therethrough to the first substrate 11 side. When the potential of the first electrode portion 4a is at L level and the potential of the second electrode portion 4b is at H level, the shutter body 3 moves toward the first electrode portion 4a side. Then, as illustrated in FIGS. 6 and 7, the portion other than the opening 3a of the shutter body 3 overlaps the light transmitting region A of the first substrate 11. In this case, the state shifts to a closed state in which light from the backlight 31 does not pass toward the first substrate 11 side. In the shutter portions S of the present embodiment, therefore, the shutter body 3 is moved by controlling the potentials of the shutter body 3, the first electrode portion 4a, and the second electrode portion 4b, so as to switch the opened state and the closed state of the light transmitting region A. In a case where a potential at L level is supplied to the shutter body 3, the shutter body 3 makes an operation reverse to that described above.

(First Substrate)

Figure 8:
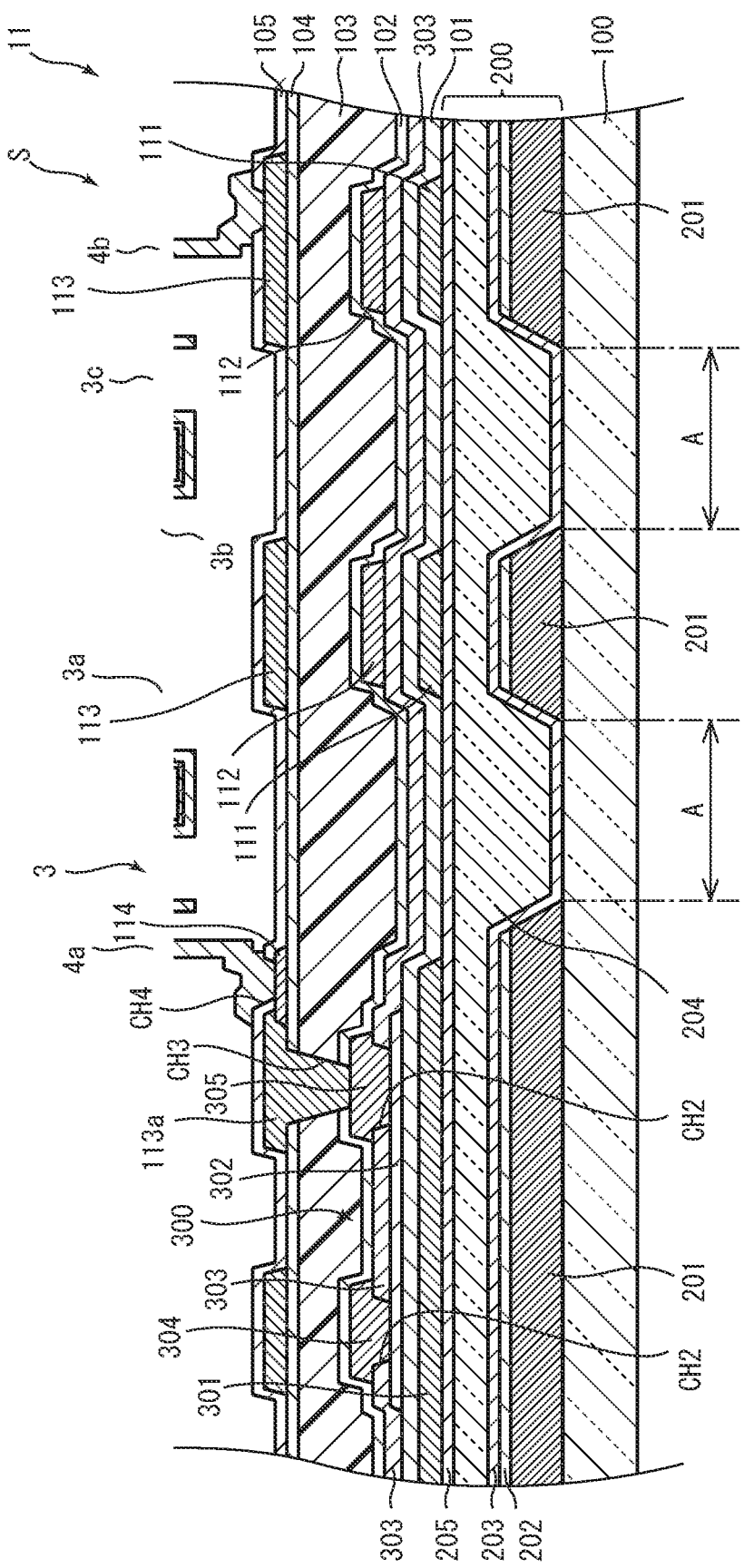
FIG. 8 is a cross-sectional view of a first substrate.

FIG. 8 is a cross-sectional view of the first substrate 11.

The first substrate 11 has such a configuration that a light-shielding section 200, TFTs 300, and shutter portions S are formed on the translucent substrate 100. In FIG. 8, one TFT is illustrated, but, actually, a plurality of TFTs are included in a single pixel P. The light-shielding section 200 includes a light-shielding film 201, a first transparent insulating film 202, a second transparent insulating film 203, a light transmission film 204, and a third transparent insulating film 205. Each TFT 300 includes a gate electrode 301, an oxide semiconductor film 302, an etching stopper layer 303, a source electrode 304, and a drain electrode 305.

Figure 9:
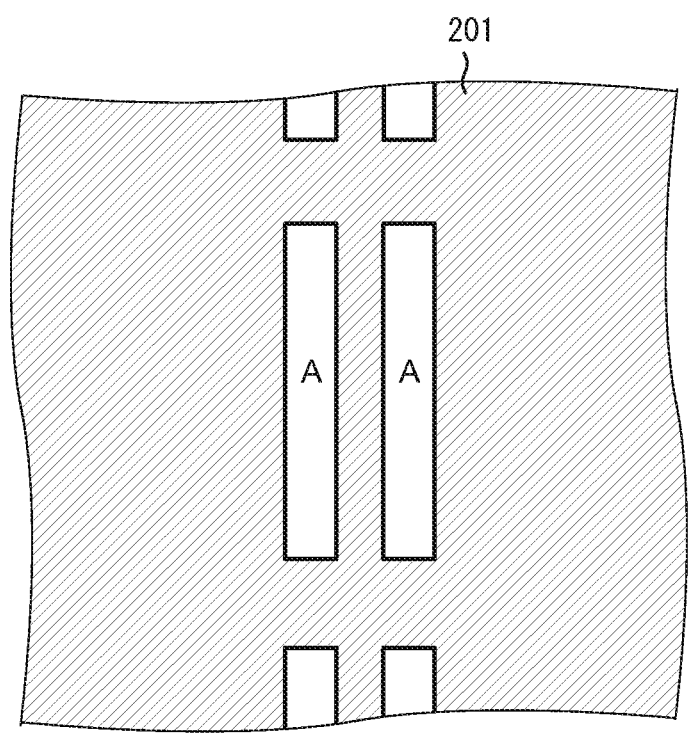
FIG. 9 is a plan view illustrating a light-shielding film.

The light-shielding film 201 is provided on the translucent substrate 100. As illustrated in FIG. 9, the light-shielding film 201 is formed so as to cover areas other than light transmitting regions A in the display region 13. This makes it possible to prevent external light that has advanced from the display viewing side into the display device 10 from advancing into the second substrate 21 side beyond the light-shielding film 201.

The light-shielding film 201 is formed with a material that hardly reflects light. This makes it possible to prevent external light that has advanced from the display viewing side into the display device 10 from being reflected by the light-shielding film 201 and going back to the display viewing side. Further, the light-shielding film 201 is formed with the material having a high resistance. This makes it possible to prevent a great parasitic capacitance from being generated between the light-shielding film 201 and conductive films forming the TFTs 300 and the like. Still further, since the light-shielding film 201 is formed prior to the TFT manufacturing process, a material that has less influence to TFT properties in subsequent processing operations in the TFT manufacturing process, and that withstand the processing operations in the TFT manufacturing process has to be selected for a material for light-shielding film 201. Examples of the material of the light-shielding film 201 that satisfy such requirements include, for example, a high-melting-point resin film (polyimide, etc.) colored in a dark color, and a SOG film. Still further, the light-shielding film 201, for example, may contain carbon black so as to be colored in a dark color.

The light transmission film 204 is provided so as to cover the light-shielding film 201. The light transmission film 204 is formed with, for example, a coating-type material. The "coating-type material" signifies a material that can form a film by coating. More specifically, a light transmission film 204 is formed with, for example, a transparent high-melting-point resin film (polyimide, etc.) or a SOG film. The light transmission film 204 may be formed with a photosensitive material.

By forming the light transmission film 204 with a coating-type material, protrusions and recesses formed in the pattern of the light-shielding film 201 can be flattened. When the patterning is performed in the process for producing the TFTs 300, therefore, the pooling of liquid such as resist or the like can be eliminated, whereby excellent patterning accuracy can be achieved.

Further, by forming the light transmission film 204 with a coating-type material, the thickness of the light transmission film 204 (the thickness of portions thereof on which the light-shielding film 201 is formed) can be increased to about 0.5 to 3 µm. This makes it possible to set a large distance between the light-shielding film 201 and a conductive film that forms the TFTs 300 and the like, which significantly suppresses parasitic capacitance that is generated between these.

Figure 10:
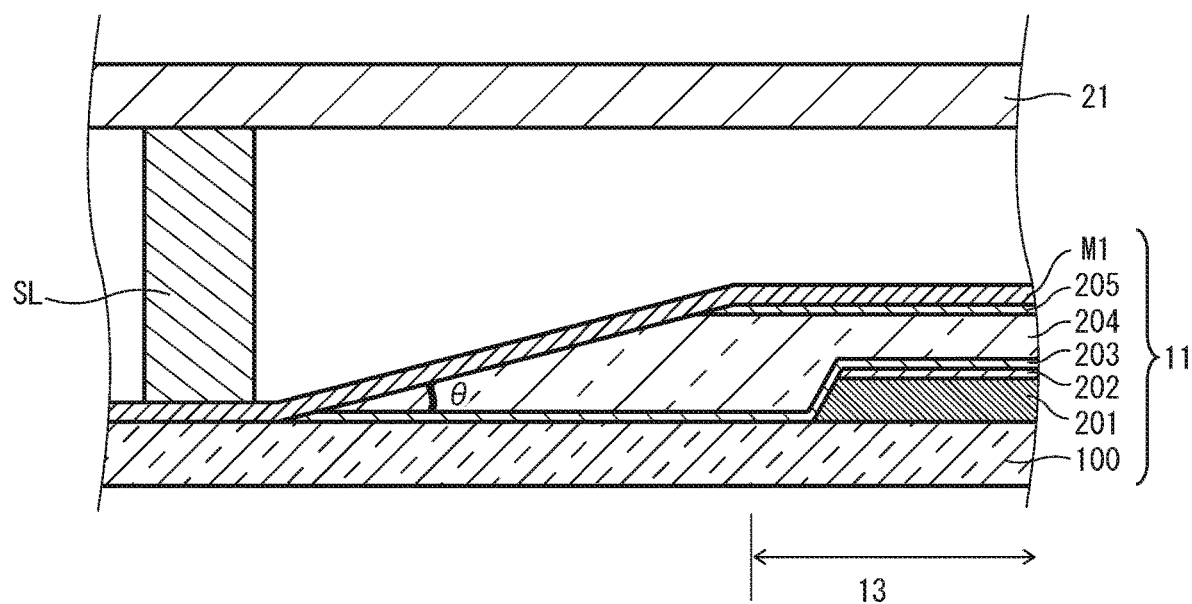
FIG. 10 is a cross-sectional view illustrating a peripheral portion of the light transmission film.

As illustrated in FIG. 10, the light transmission film 204, in an outer peripheral portion of the display region 13, the film thickness gradually decreases, in such a direction as the proximity to the display region 13 decreases. In other words, in the outer peripheral portion of the display region 13, the surface of the light transmission film 204 forms a surface inclined with respect to the translucent substrate 100. The angle θ formed between this inclined surface and the translucent substrate 100 is preferably smaller than 20°. More preferably, the angle θ is 3° to 10°. As illustrated in FIG. 10, the first substrate 11 and the second substrate 21 are bonded to each other in the peripheral portion of the display region 13 with a sealing material SL, and the space formed between the substrates 11 and 21 is sealed with the sealing material SL. The sealing material SL is arranged on an outer circumference side with respect to the light transmission film 204, so that the sealing material SL does not overlap the inclined surface of the light transmission film 204.

Since the thickness of the light transmission film 204 is, for example, 0.5 µm or more, the steps formed by the light transmission film 204 become greater in the outer peripheral portion of the pattern of the light transmission film 204. However, since, in the outer peripheral portion of the light transmission film 204, the surface of the light transmission film 204 forms a surface inclined with respect to the translucent substrate 100 and the angle θ formed between the inclined surface and the translucent substrate 100 is smaller than 20°, even in a case where lines and the like rise from the surface of the translucent substrate 100 onto the light transmission film 204, it is possible to prevent the lines (in FIG. 10, lines formed with the first conductive films M1 to be described below) from becoming disconnected. Even in the case of lines formed with second conductive films M2 and third conductive films M3 to be described below, similarly to the lines formed with the first conductive films M1, it is also possible to prevent the lines from becoming disconnected. Further, since the surface of the light transmission film 204 forms a surface inclined with respect to the translucent substrate 100 and the angle θ formed between the inclined surface and the translucent substrate 100 is smaller than 20°, it is possible to prevent cracks from occurring in the light transmission film 204 in a high temperature annealing step in the TFT manufacturing process.

The relationship between the angle θ formed between the inclined surface of the peripheral portion of the light transmission film 204 and the translucent substrate 100 and the occurrence of cracks in the light transmission film 204 was examined. The results are illustrated in Table 1.

TABLE 1

| Angle θ | 3° | 5° | 10° | 20° | 40° |
|---|---|---|---|---|---|
| Line disconnection, cracks | None | None | None | Observed | Observed |

In Table 1, cases where disconnection of a line that rises from the translucent substrate 100 onto the light transmission film 204 occurred, or cases where cracks occurred to the light transmission film 204 are evaluated as "Observed".

Cases where neither problem occurred are evaluated as "None". This proves that the angle θ formed between the inclined surface of the outer peripheral portion of the light transmission film 204 and the translucent substrate 100 is preferably 3° to 10°.

The first transparent insulating film 202 and the second transparent insulating film 203 are provided between the light-shielding film 201 and the light transmission film 204. Since the first transparent insulating film 202 is provided, the wettability and the adhesiveness with a resist material when the light-shielding film 201 is patterned can be improved. Further, since the second transparent insulating film 203 is provided to cover the entire surface of the light-shielding film 201, a dark color material such as carbon black can be prevented from being oxidized by high temperature annealing and becoming transparent.

Further, in the display region 13, the third transparent insulating film 205 is provided so as to cover the light transmission film 204. Since the third transparent insulating film 205 is provided, the wettability and the adhesiveness with a resist material when the light transmission film 204 is patterned can be improved. Further, since the third transparent insulating film 205 is provided, the adhesiveness between the light transmission film 204 and either first conductive films M1 to be described below or a gate insulating film 101 to be described below can be improved.

Incidentally, the configuration of the second transparent insulating film 203 can be omitted. Further, in a case where the third transparent insulating film 205 covers the entire surface of the light-shielding film 201, the third transparent insulating film 205 can prevent carbon black from becoming transparent upon high temperature annealing, which allows the configuration of the first transparent insulating film 202 to be omitted.

The gate electrodes 301 are formed with first conductive films M1. The first conductive films M1 also form the lines 111 and the like, in addition to the gate electrodes 301 of the TFTs 300. Further, the source electrodes 304 and the drain electrodes 305 are formed with the second conductive films M2. The second conductive films M2 also form the lines 112 and the like, in addition to the source electrodes 304 and the drain electrodes 305 of the TFTs 300. The oxide semiconductor films 302 are formed with, for example, oxide semiconductor films of the In—Ga—Zn—O type, or the like.

The gate electrodes 301 are covered with the gate insulating film 101. The source electrodes 304 and the drain electrodes 305 are covered with passivation films 102. The passivation film 102 is further covered with a flattening film 103 and a passivation film 104. The TFT 300 has a conventionally known configuration.

In the passivation film 102, the flattening film 103, and the passivation film 104, there are provided contact holes CH3 that reach the drain electrodes 305. On the passivation film 104, lines 113 are formed. Parts 113a of the lines 113 are provided so as to cover surfaces of the contact holes CH3, and are electrically connected with drain electrodes 305. The lines 113 are formed with third conductive films M3. The lines 113 are connected to the first electrode portions 4a, the second electrode portions 4b, the shutter bodies 3 and the like of the shutter portions S. The parts of 113a of the lines 113 may be electrically connected with the transparent conductive films 114 provided on the surface of the passivation film 104. The lines 113 are covered with the passivation film 105.

On the passivation film 105, there are provided the shutter portions S. The configuration of the shutter portion S is as mentioned above. The shutter body 3, however, has a configuration in which the shutter main bodies 3b on the translucent substrate 100 side and a metal film 3c are laminated.

(Producing Method)

Figure 11:
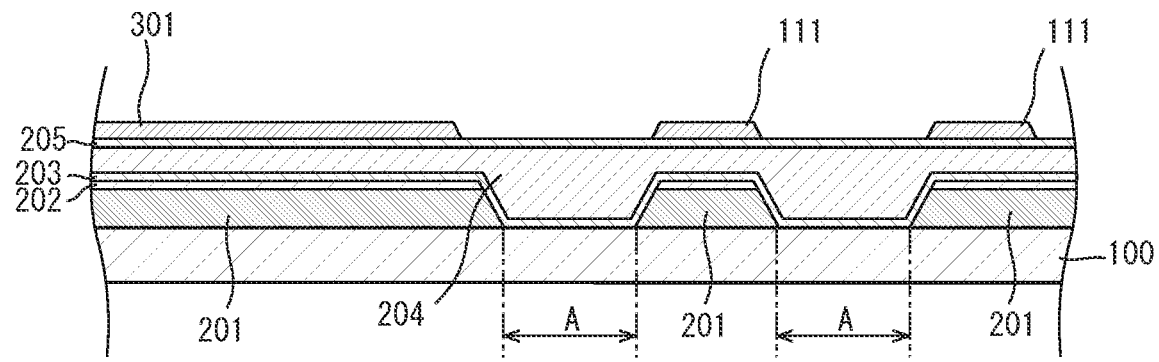
FIG. 11 is an explanatory view illustrating a method for producing the first substrate.

First, the translucent substrate 100 is prepared. Then, as illustrated in FIG. 11, the light-shielding film is formed by using the spin coating method. Then, the film is baked in an atmosphere at 200° C. to 350° C. for about one hour, whereby the light-shielding film 201 is formed. A SOG film may be formed by the slit coating method, in place of the spin coating method.

Subsequently, a $SiO_2$ film is formed on the translucent substrate 100 by the PECVD method so as to cover the light-shielding film 201. The temperature during the film formation is, for example, 200° C. to 350° C. The obtained $SiO_2$ film has a thickness of, for example, 50 nm to 200 nm. The $SiO_2$ film is patterned by photolithography so that the $SiO_2$ film is patterned in the same pattern as that of the light-shielding film 201. More specifically, dry etching is performed by using $CF_4$ gas and $O_2$ gas, so that the first transparent insulating film 202 is formed.

Next, a $SiO_2$ film is formed on the translucent substrate 100 so as to cover the entire surfaces of the first transparent insulating film 202 and the light-shielding film 201 by the PECVD method, whereby the second transparent insulating film 203 is formed. The temperature during the film formation is, for example, 200° C. to 350° C. The $SiO_2$ film obtained has a thickness of, for example, 50 nm to 200 nm.

Then, the first transparent insulating film 202 and the second transparent insulating film 203 thus formed are annealed in a nitrogen atmosphere. The temperature at which the annealing is performed is, for example, 350° C. to 500° C. The time while the annealing is performed is, for example, about one hour. The annealing may be performed in, for example, in a clean dry air (CDA) atmosphere, in place of the nitrogen atmosphere. By preliminarily annealing the light-shielding film 201, cracks are prevented from occurring in the light-shielding film 201 at the step of the high temperature annealing in the subsequent TFT manufacturing process. Since the entire surface of the light-shielding film 201 is covered with the first transparent insulating film 202, the dark color material such as carbon black is prevented from being oxidized by high temperature annealing and becoming transparent.

Next, a light transmission film is formed by the spin coating method. Then, the film is baked in an atmosphere at 200° C. to 350° C. for about one hour. Then, by performing the patterning with use of a gray tone mask or the patterning without a mask, a light transmission film on the peripheral portion of the display region 13 is removed, whereby the light transmission film 204 is formed. Here, by performing the patterning with use of a gray tone mask or the patterning without a mask, the taper shape illustrated in FIG. 10 can be formed. The light transmission film 204 may be formed by the slit coating method, in place of the spin coating method. Further, the light transmission film 204 may be formed with, for example, a material having photosensitivity. By forming the light transmission film 204 with a material having photosensitivity, the steps of the producing process can be decreased.

Next, a $SiO_2$ film is formed by the PECVD method so as to cover the light transmission film 204. The temperature during the film formation is, for example, 200° C. to 350° C. The obtained $SiO_2$ film has a thickness of, for example, 50 nm to 200 nm. The $SiO_2$ film is patterned by photolithography so that the $SiO_2$ film is formed in the same pattern as that of the light transmission film 204 in the display region 13. More specifically, by performing dry etching with use of $CF_4$ gas and $O_2$ gas, the third transparent insulating film 205 is formed.

The third transparent insulating film 205 thus formed is annealed in a nitrogen atmosphere. The temperature at which the annealing is performed is, for example, 350° C. to 500° C. The time while the annealing is performed is, for example, about one hour. The annealing may be performed in, for example, a clean dry air (CDA) atmosphere, in place of the nitrogen atmosphere. By preliminarily annealing the light transmission film 204, cracks are prevented from occurring in the light transmission film 204 at the step of the high temperature annealing in the subsequent TFT manufacturing process.

The temperature at which the annealing is performed, which is described above, is preferably at or above the temperature at the step in the subsequent process for manufacturing TFTs 300 (the temperature for film forming by CVD, or the annealing temperature). Annealing at a temperature at or above the temperature in the TFT manufacturing process prevents moisture and the like contained in the light transmission film 204 from oozing out into the TFTs 300 and causing failures of the TFTs 300.

Next, a single layer film or a laminate film composed of any of a metal film such as an aluminum (Al) film, a tungsten (W) film, a molybdenum (Mo) film, a tantalum (Ta) film, a chromium (Cr) film, a titanium (Ti) film, a copper (Cu), or the like, or a film containing an alloy of any of the foregoing metals, is laminated and patterned, whereby the first conductive film M1 is formed. The first conductive film M1 has a thickness of, for example, 50 nm to 500 nm.

Figure 12:
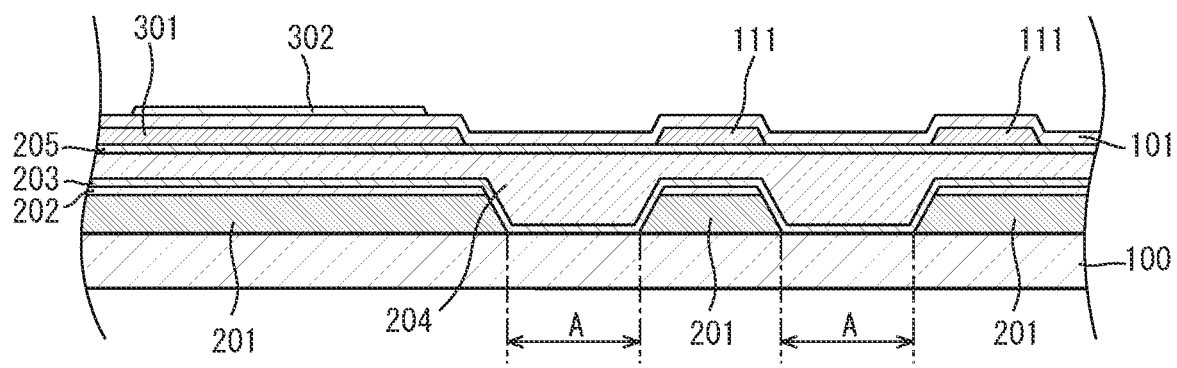
FIG. 12 is an explanatory view illustrating a method for producing the first substrate.

Next, as illustrated in FIG. 12, a $SiN_x$ film is formed by the PECVD method on the third transparent insulating film 205 so as to cover the first conductive film M1. The gate insulating film 101 may be a silicon-based inorganic film ($SiO_2$ film or the like) containing oxygen, a laminate film of a $SiO_2$ film and a $SiN_x$ film, or the like. The gate insulating film 101 is formed by forming a $SiO_2$ film and a $SiN_x$ film. The obtained gate insulating film 101 has a thickness of, for example, 100 nm to 500 nm.

Next, an oxide semiconductor film is formed by, for example, the sputtering method. Then, the oxide semiconductor film is patterned, whereby the oxide semiconductor films 302 are formed in areas corresponding to the thin film transistors.

Then, the oxide semiconductor film 302 thus formed is annealed in a nitrogen atmosphere. The temperature at which the annealing is performed is, for example, 350° C. to 500° C. The time while the annealing is performed is, for example, about one hour. The annealing may be performed in, for example, a clean dry air (CDA) atmosphere, in place of the nitrogen atmosphere.

Next, a $SiO_2$ film is formed by the PECVD method so as to cover the gate insulating film 101 and the oxide semiconductor film 302, whereby an etching stopper layer 303 is formed. The $SiO_2$ film thus obtained has a thickness of, for example, 100 nm to 500 nm. Then, contact holes CH1, CH2 for allowing the source electrodes 304 and the drain electrodes 305 of the TFTs 300 to reach the oxide semiconductor film 302 are formed.

Figure 13:
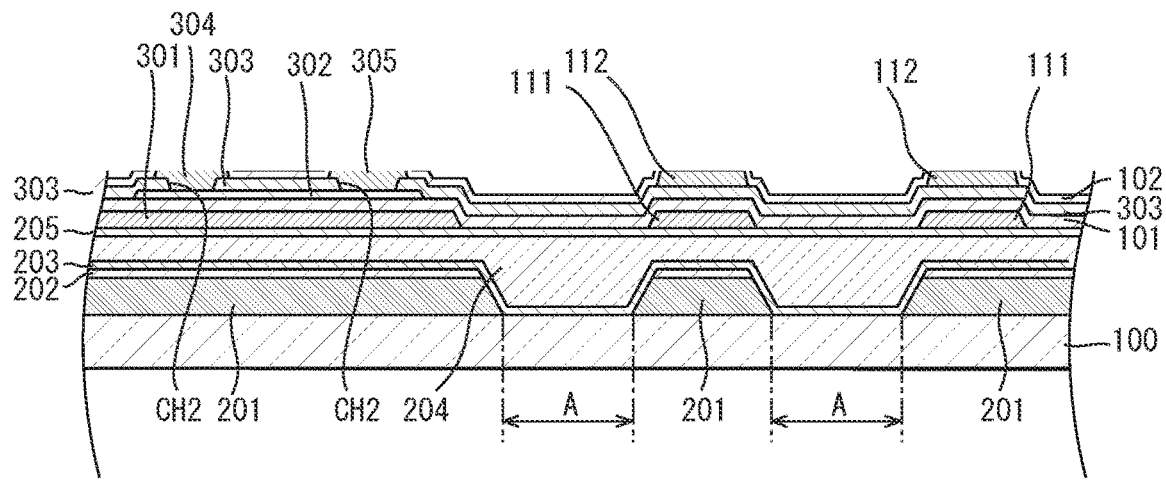
FIG. 13 is an explanatory view illustrating a method for producing the first substrate.

Subsequently, as illustrated in FIG. 13, a single layer film or a laminate film composed of any of a metal film such as an aluminum (Al) film, a tungsten (W) film, a molybdenum (Mo) film, a tantalum (Ta) film, a chromium (Cr) film, a titanium (Ti) film, a copper (Cu), or the like, or a film containing an alloy of any of the foregoing metals, is laminated by the sputtering method, whereby the second conductive film M2 is formed. Then, the second conductive film M2 is patterned by photolithography, whereby the source electrodes 304, the drain electrodes 305, the lines 112, signal lines (not shown), and the like, are formed. The second conductive film M2 has a thickness of, for example, 50 nm to 500 nm.

Next, a $SiO_2$ film is formed by the PECVD method so as to cover the gate insulating film 101 and the oxide semiconductor film 302, whereby the passivation film 102 is formed. The $SiO_2$ film has a thickness of, for example, 100 nm to 500 nm.

Figure 14:
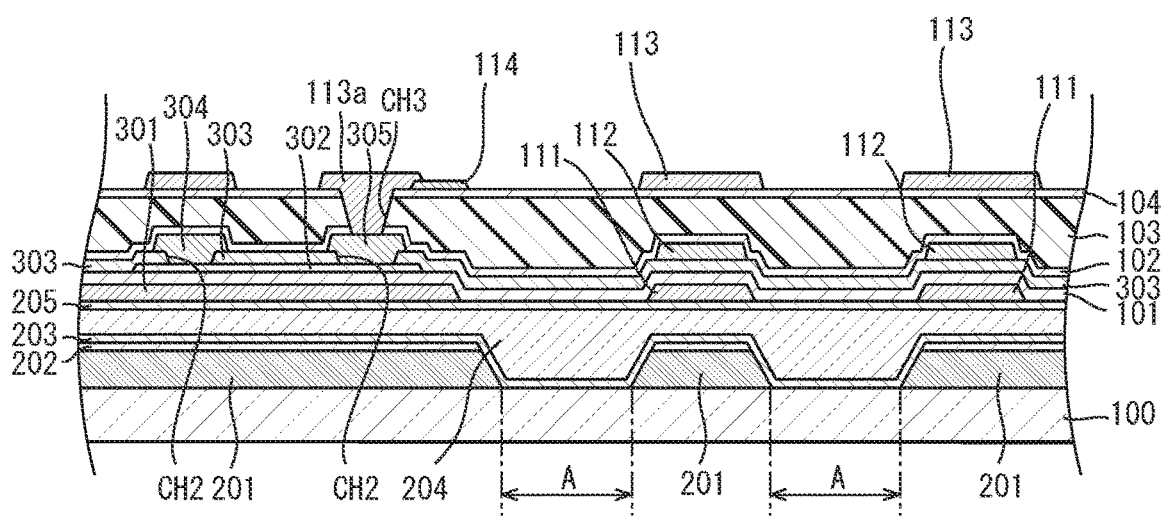
FIG. 14 is an explanatory view illustrating a method for producing the first substrate.

Next, as illustrated in FIG. 14, a photosensitive resin film is formed by the spinning method, whereby the flattening film 103 is formed. Here, the flattening film 103 formed has a thickness of, for example 0.5 µm to 3 µm.

Next, a $SiN_x$ film is formed by the PECVD method so as to cover the flattening film 103, whereby the passivation film 104 is formed. The $SiN_x$ film obtained has a thickness of, for example, 100 nm to 500 nm. Then, by etching the passivation film 102, the flattening film 103, and the passivation film 104, contact holes CH3 that reach the drain electrodes 305 from the surface of the passivation film 104 are formed.

Next, on the surface of the passivation film 104, and in the vicinities of the contact holes CH3, transparent conductive films 114 are formed by, for example, the sputtering method.

Subsequently, a single layer film or a laminate film composed of any of a metal film such as an aluminum (Al) film, a tungsten (W) film, a molybdenum (Mo) film, a tantalum (Ta) film, a chromium (Cr) film, a titanium (Ti) film, a copper (Cu), or the like, or a film containing an alloy of any of the foregoing metals, is laminated by the sputtering method, whereby the third conductive film M3 is formed. Then, the third conductive film M3 is patterned by photolithography, whereby the lines 113 and the like are formed in areas other than the light transmitting regions A.

Figure 15:
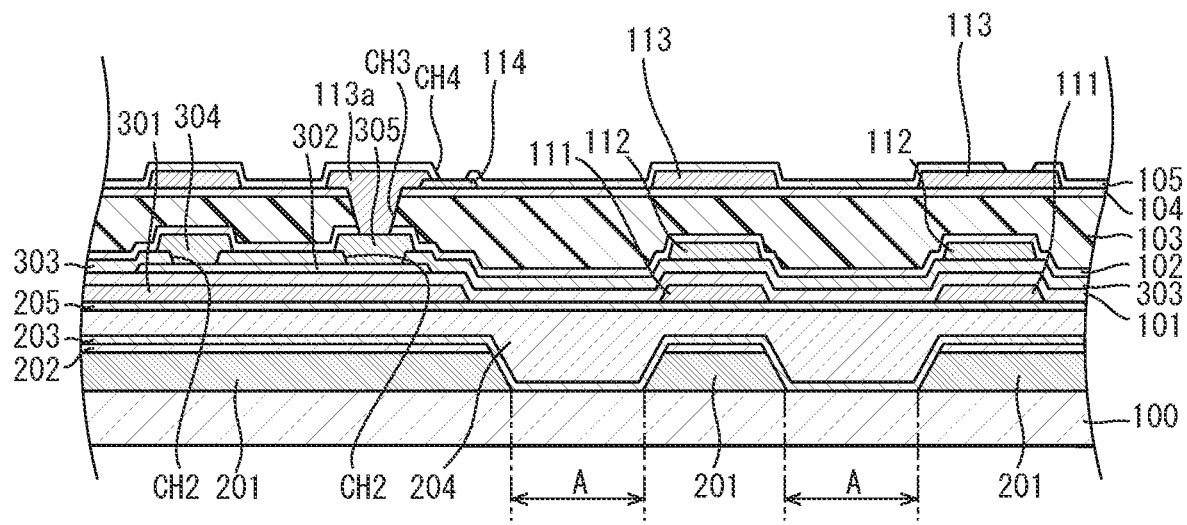
FIG. 15 is an explanatory view illustrating a method for producing the first substrate.

Next, as illustrated in FIG. 15, a $SiN_x$ film is formed by the PECVD method on the passivation film 104 so as to cover the lines 113, the transparent conductive films 114, and the like, whereby the passivation film 105 is formed. The $SiN_x$ film thus obtained has a thickness of, for example, 100 nm to 500 nm. Then, by etching the passivation film 105, contact holes CH4 that reach the transparent conductive films 114 from the surface of the passivation film 105 are formed.

Figure 16:
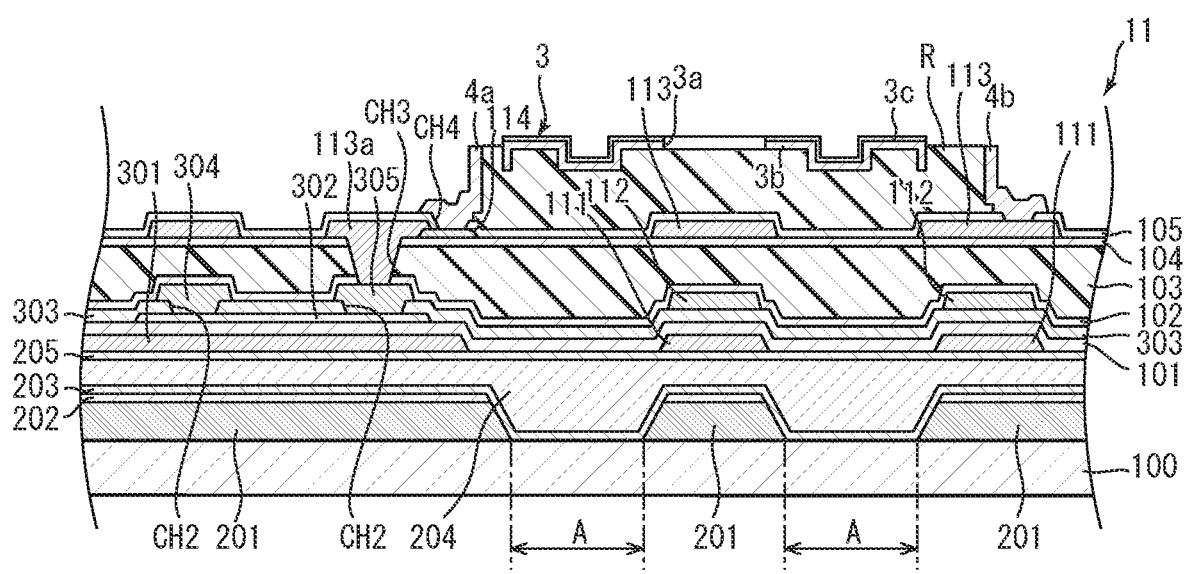
FIG. 16 is an explanatory view illustrating a method for producing the first substrate.

Next, as illustrated in FIG. 16, a resist R is coated over areas including at least the light transmitting regions A by, for example, the spin coating method.

Next, an amorphous silicon (a-Si) layer is formed by the PECVD method so as to cover the resist R. Here, the film is formed so as to cover both of the top surfaces and the side surfaces of the resist R. The a-Si layer formed has a thickness of, for example, 200 nm to 500 nm. Then, the a-Si layer is patterned by photolithography, whereby the first electrode portions 4a, the second electrode portions 4b, the shutter beams 5 (not shown in FIG. 8), and the shutter main bodies 3b are formed. The first electrode portions 4a and the second electrode portions 4b are composed of portions of the a-Si layer formed on the side surfaces of the resist R.

Subsequently, metal films 3c are provided so as to form layers above the shutter main bodies 3b. A single layer film or a laminate film composed of any of a metal film such as an aluminum (Al) film, a tungsten (W) film, a molybdenum (Mo) film, a tantalum (Ta) film, a chromium (Cr) film, a titanium (Ti) film, a copper (Cu), or the like, or a film containing an alloy of any of the foregoing metals, is laminated by, for example, the sputtering method, whereby each metal film 3c is formed. Thus, the shutter bodies 3 are formed.

Figure 17:
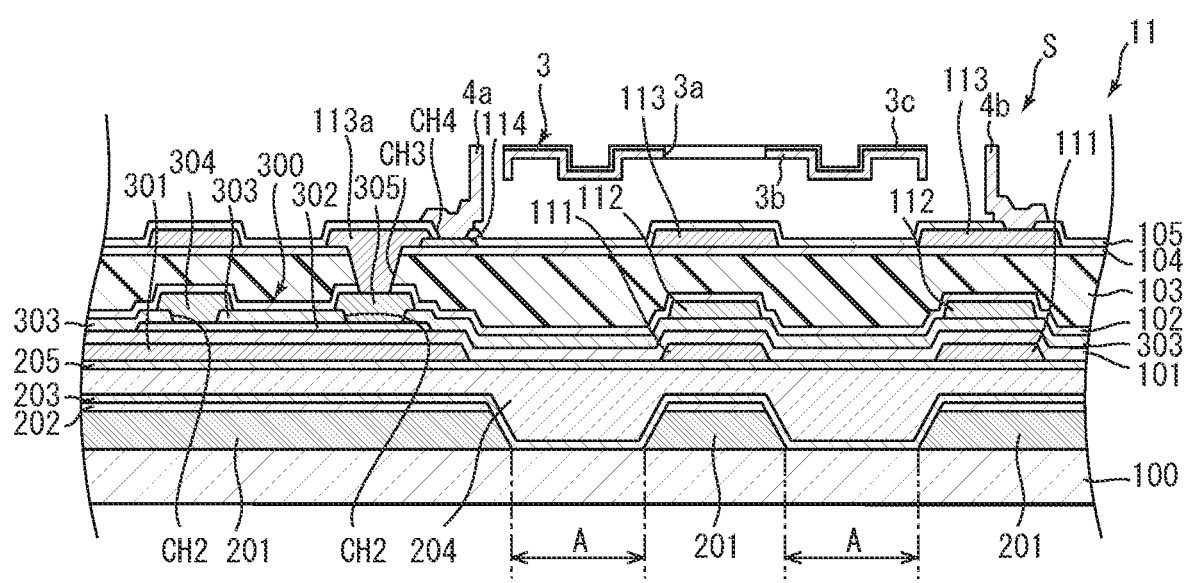
FIG. 17 is an explanatory view illustrating a method for producing the first substrate.
Figure 18:
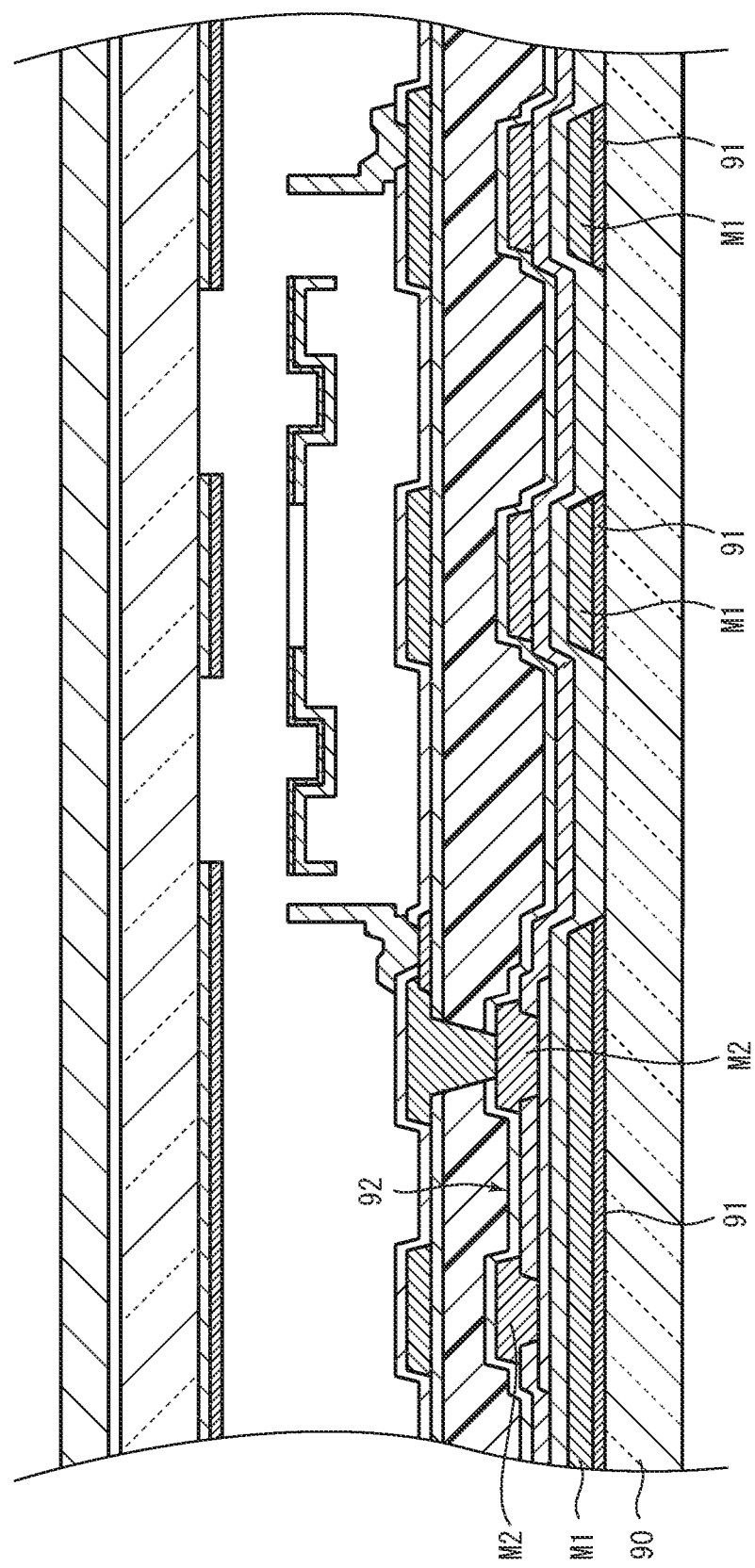
FIG. 18 is a cross-sectional view of a display device of a conventional configuration

Finally, as illustrated in FIG. 17, the resist R is removed by the spinning method. This causes the shutter bodies 3 to be arranged in a state of being floated from the passivation film 105, with a space therebetween. The shutter bodies 3 are supported by the shutter beam anchors 8, via the shutter beams 5.

Through the above-described steps, the first substrate 11 is produced.

MODIFICATION EXAMPLES

In the description of the present embodiment, it is described that the light-shielding film 201 is formed so as to cover areas of the display region 13 other than the light transmitting regions A, but it is only required that the light-shielding film 201 is provided at least in areas where the TFTs 300 are formed. This prevents the TFTs 300 from being exposed to external light that has advanced from the viewing side of the display device 10.

In the description of the present embodiment, it is described that the light transmission film 204 is provided so as to cover the light-shielding film 201, but the light transmission film 204 is not a requisite configuration.

In the present embodiment, each of the first transparent insulating film 202, the second transparent insulating film 203, and the third transparent insulating film 205 may be a silicon-based inorganic film ($SiO_2$ film) containing oxygen, or may be a silicon nitride film ($SiN_x$ film) containing nitrogen. Or alternatively, it may be a laminate film of these films. In the description, it is described that the PECVD method is used as the respective methods for forming the first transparent insulating film 202, the second transparent insulating film 203, and the third transparent insulating film 205, but they may be formed by the sputtering method.

In the description of the present embodiment, it is described that the semiconductor layer of the TFT 300 is made of a compound (In—Ga—Zn—O) composed of indium (In), gallium (Ga), zinc (Zn), and, oxygen (O), but the present invention is not limited to this. The semiconductor layer of the TFT 300 may be made of a compound (In-Tin-Zn—O) composed of indium (In), tin (Tin), zinc (Zn), and oxygen (O), or alternatively, a compound (In—Al—Zn—O) composed of indium (In), aluminum (Al), zinc (Zn), and oxygen (O). Further, the semiconductor layer of the TFT 300 may be made of amorphous silicon, low-temperature polysilicon, or the like.

The above-described embodiment is merely an example for implementing the present invention. The present invention, therefore, is not limited by the above-described embodiment, and the above-described embodiment can be appropriately varied and implemented without departing from the spirit and scope of the invention.

INDUSTRIAL APPLICABILITY

The present invention is applicable to a display device in which mechanical shutters are used.

The invention claimed is:
1. A display device including a plurality of pixels, the display device comprising:
a translucent substrate;
a light-shielding film provided on the translucent substrate and including an opening in a light transmitting region;
a first transparent insulating film that is provided on the translucent substrate to cover the light-shielding film;
a second transparent insulating film that is provided to cover the first transparent insulating film and the translucent substrate;
a light transmission film provided on the second transparent insulating film;
a plurality of thin film transistors that are provided on the light transmission film and include a portion of a line made of a conductive film; and
a third transparent insulating film provided on the light transmission film and below a gate electrode of each of the plurality of thin film transistors, wherein
the light-shielding film is arranged to overlap at least the thin film transistors, when viewed in a direction vertical to the translucent substrate,
the first transparent insulating film covers an entire surface of the light-shielding film,
a thickness of the light-shielding film is larger than a thickness of the first transparent insulating film,
a thickness of the light transmission film is larger than a thickness of the light-shielding film,
the light transmission film fills the opening of the light-shielding film,
the light transmission film includes, in an outer peripheral portion of a display region, an edge surface inclined with respect to the translucent substrate,
the line extends from the display region to an outside of the display region and intersects with the edge surface of the light transmission film,
the second transparent insulating film includes an edge aligned with a lower edge of the edge surface of the light transmission film,
the third transparent insulating film includes an edge aligned with an upper edge of the edge surface of the light transmission film, and
the line intersects with the edge of the second transparent insulating film and the edge of the third transparent insulating film.

2. The display device according to claim 1, wherein the light-shielding film is arranged in entire areas of the plurality of pixels except for the light transmitting regions, when viewed in a direction vertical to the translucent substrate.

3. The display device according to claim 1, wherein the first transparent insulating film is a silicon-based inorganic film containing oxygen or nitrogen.

4. The display device according to claim 1, wherein the first transparent insulating film includes two or more layers of transparent insulating films that are laminated.

5. The display device according to claim 1, wherein the light transmission film is made of a coating-type material.

6. The display device according to claim 1, wherein, in a peripheral portion of the translucent substrate, an angle defined between a surface of the translucent substrate and a surface of the light transmission film is smaller than 20°.

7. The display device according to claim 6, further comprising:
a counter substrate that is arranged to be opposed to the translucent substrate; and
a ring-shaped sealing material that bonds the peripheral portion of the translucent substrate and the counter substrate,
wherein, in the peripheral portion of the translucent substrate, the sealing material is arranged to not overlap the edge surface of the light transmission film.

8. The display device according to claim 1, wherein the thin film transistor includes an oxide semiconductor film.

9. The display device according to claim 1, wherein
the first transparent insulating film includes an opening,
an edge of the first transparent insulating film in the opening of the first transparent insulating film and an edge of the light-shielding film in the opening of the light-shielding film are aligned and covered with the second transparent insulating film, and
a thickness of the light-shielding film is larger than a thickness of the first transparent insulating film.

10. The display device according to claim 1, wherein a portion of the light transmission film in an outer peripheral portion is exposed by the third transparent insulating film.

11. The display device according to claim 1, wherein the portion of the light transmission film in an outer peripheral portion does not overlap with the light-shielding film or the third transparent insulating film.

12. The display device according to claim 1, wherein each of the plurality of thin film transistors further includes a gate insulating film, and a semiconductor film opposing the gate electrode via the gate insulating film.

13. A method for producing the display device according to claim 1, the method comprising:
a first annealing step of baking the first transparent insulating film; and
a second annealing step of baking the thin film transistor, wherein a treatment temperature in the first annealing step is at or above the treatment temperature in the second annealing step.

* * * * *